US008372729B1

(12) United States Patent
Cheng et al.

(10) Patent No.: US 8,372,729 B1
(45) Date of Patent: Feb. 12, 2013

(54) INTEGRATED CIRCUIT DEVICES WITH ESD PROTECTION IN SCRIBE LINE, AND METHODS FOR FABRICATING SAME

(75) Inventors: Chuan-Cheng Cheng, Fremont, CA (US); Choy Hing Li, Saratoga, CA (US); Shuhua Yu, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/285,928

(22) Filed: Oct. 31, 2011

Related U.S. Application Data

(62) Division of application No. 11/521,731, filed on Sep. 14, 2006, now Pat. No. 8,049,249.

(51) Int. Cl.
*H01L 23/48* (2006.01)
*H01L 23/58* (2006.01)
*H01L 23/485* (2006.01)

(52) U.S. Cl. ........ 438/462; 257/173; 257/355; 257/618; 257/620; 257/758; 257/E23.07; 257/E23.013; 438/68; 438/113; 438/458

(58) Field of Classification Search .................. 257/173, 257/355, 618, 620, E23.07, E27.013, 758; 438/68, 113, 458, 462
See application file for complete search history.

(56) References Cited

U.S. PATENT DOCUMENTS

| 5,371,390 | A | 12/1994 | Mohsen |
| 5,399,902 | A | 3/1995 | Bickford et al. |
| 6,492,666 | B2 * | 12/2002 | Terada et al. ................. 257/202 |
| 6,939,744 | B2 | 9/2005 | Farnworth et al. |
| 7,049,699 | B1 | 5/2006 | Masleid et al. |
| 7,274,048 | B2 | 9/2007 | Wu |
| 7,339,256 | B2 | 3/2008 | Nakamura et al. |
| 7,510,323 | B2 * | 3/2009 | Rahman et al. ............... 374/163 |
| 7,563,694 | B2 * | 7/2009 | Burnside et al. .............. 438/462 |
| 2003/0030129 | A1 | 2/2003 | Terada et al. |
| 2005/0167842 | A1 | 8/2005 | Nakamura et al. |
| 2005/0173806 | A1 | 8/2005 | Matsubara |
| 2005/0263847 | A1 | 12/2005 | Anzai et al. |
| 2007/0013072 | A1 | 1/2007 | Ellis-Monaghan et al. |

OTHER PUBLICATIONS

Cheng et al.; Integrated Circuit Devices and Systems with ESD and I/O Protection and Methods for Fabricating Same; U.S. Appl. No. 11/505,782, filed Aug. 16, 2006.
Cheng et al; New Approach for ESD Protection; U.S. Appl. No. 60/765,968, filed Feb. 7, 2006.

* cited by examiner

Primary Examiner — Matthew W Such
Assistant Examiner — David Spalla

(57) ABSTRACT

A semiconductor wafer including an electrostatic discharge (ESD) protective device, and methods for fabricating the same. In one aspect, the method includes forming a first semiconductor device in a first semiconductor die region on the semiconductor wafer; forming a second semiconductor device in a second semiconductor die region on the semiconductor wafer; and forming a protective device in a scribe line region between (i) the first semiconductor die region and (ii) the second semiconductor die region.

19 Claims, 6 Drawing Sheets

INTEGRATED CIRCUIT DEVICES WITH ESD PROTECTION IN SCRIBE LINE, AND METHODS FOR FABRICATING SAME

RELATED APPLICATIONS

The present disclosure is a divisional of U.S. application Ser. No. 11/521,731, filed on Sep. 14, 2006.

FIELD OF THE INVENTION

The present invention generally relates to the field of integrated circuit devices. More specifically, embodiments of the present invention pertain to integrated circuit device wafers with electrostatic discharge (ESD) protection structures formed in the scribe lines between semiconductor dies.

DISCUSSION OF THE BACKGROUND

In semiconductor manufacturing, the cost of a semiconductor die generally corresponds to its size. As components in semiconductor dies become smaller, the dies themselves can shrink, and more dies can be produced from a single semiconductor wafer. Thus, the cost of die may decrease even if the smaller manufacturing process is marginally more expensive. However, some structures have a size relatively independent of the minimum feature size of the technology (or at least less dependent on minimum process dimensions than other components). Structures such as electrostatic discharge protection devices, wire bond pads, input and/or output (I/O) bond pads, I/O driver circuits, voltage regulators, capacitors, inductors, etc. may have a relatively constant size even as other components shrink.

Integrated circuit devices typically require some kind of protection against overvoltages (e.g., electrostatic discharges) that may be inadvertently applied to a terminal thereof. For example, both externally-applied DC and alternating current (AC) power sources are configured to provide a nominal power supply, or standard voltage, to an integrated circuit (IC) for its operation. On occasion, these power sources may pass to the IC transient or sustained voltages that are significantly above nominal level. In addition, human handlers and/or electronic equipment may carry or generate a significant static electrical charge, sometimes on the order of a thousand to two thousand volts or more. For example, when a human handler inadvertently touches the leads of an IC and passes such a high static charge to an input buffer on the IC, significant (and sometimes fatal) damage can be done to the IC if the IC is without some kind of protection against such ESD.

Currently, ESD protective structures may consume a substantial portion of a semiconductor die manufactured using modern manufacturing processes (e.g., 0.13 µm, 90 nm, 65 nm, etc.). Thus, these larger structures may be relatively more expensive to produce in a smaller manufacturing process than in an older manufacturing process (e.g., 0.18 µm, 0.25 µm, etc.). Integrated circuit devices that are manufactured using advanced processes and that omit ESD and/or I/O protection structures (e.g., by offloading such structures to a die manufactured using a less advanced manufacturing process) are disclosed in U.S. patent application Ser. No. 11/505,782, filed Aug. 16, 2006, pending, and U.S. Provisional Application No. 60/765,968, filed Feb. 7, 2006, the disclosures of which are hereby incorporated by reference.

However, wafers containing integrated circuit devices may be subject to electrostatic discharge during the manufacturing, testing, packaging, and/or assembly processes. After the integrated circuit structures have been formed on a semiconductor wafer, the wafer may be subject to ESD events during wafer sorting (e.g., testing and/or marking of each die on the wafer), bench grinding, and/or bump formation (e.g., formation of bumps for flip-chip bonding). The wafer may also be subject to ESD during the dicing step, wherein the wafer may be sawed or otherwise separated into individual semiconductor dies. Thus, it is desirable to provide ESD protection for integrated circuit device wafers during the manufacturing process without consuming valuable area on the semiconductor dies.

SUMMARY OF THE INVENTION

Embodiments of the present invention relate to a semiconductor wafer with protective devices in the scribe lines, a semiconductor die, methods for forming such wafers and devices, and methods for protecting a semiconductor wafer. In one embodiment, the semiconductor wafer comprises (a) first and second adjacent semiconductor die regions, (b) a protective device in a scribe line region between the adjacent die regions, and (c) at least one metal line on a surface of the first die region, in electrical communication with the protective device. In a preferred embodiment, the at least one metal line comprises a mesh on the surface of the first die region. The protective device may comprise an ESD protective device.

In one embodiment, the semiconductor die comprises (a) an exposed terminal on a surface of the die, wherein the exposed terminal is configured to communicate electrical signals to or from the semiconductor die, and (b) a mesh of metal lines on the surface of the die, wherein the mesh is not in electrical communication with the exposed terminal.

In one aspect, the method of forming a semiconductor device (e.g., an integrated circuit device) includes the steps of (a) forming a semiconductor device in a first semiconductor die region on a semiconductor wafer, (b) forming a protective device in a scribe line region between the first semiconductor die region and an adjacent second semiconductor die region, and (c) forming at least one metal line on a surface of the first die region, wherein the at least one metal line is in electrical communication with the protective device.

In another aspect, the method of protecting a semiconductor wafer includes the steps of (a) forming an electrostatic discharge (ESD) protective device in a scribe line region of a semiconductor wafer (wherein the wafer may comprise a plurality of semiconductor devices formed in a plurality of semiconductor die regions and one or more scribe line regions, each scribe line region being positioned between two adjacent semiconductor die regions), (b) forming at least one metal line on a surface of at least one of the plurality of semiconductor die regions, wherein the at least one metal line is in electrical communication with the ESD protective device, and (c) processing the wafer after forming the at least one metal line.

The present invention advantageously provides protective devices (e.g., ESD protective devices) during the wafer manufacturing process for semiconductor devices that may otherwise lack significant or effective protective devices on the same semiconductor die. Protective devices are located instead in scribe line regions of the wafer which are destroyed when the wafer is sawed or otherwise separated into individual semiconductor die. Accordingly, valuable space on the finished semiconductor device is not consumed by certain structures which do not substantially benefit from smaller (and/or more expensive) process technology.

These and other advantages of the present invention will become readily apparent from the detailed description of preferred embodiments below.

DETAILED DESCRIPTION OF THE PREFERRED EMBODIMENTS

Figure 1:
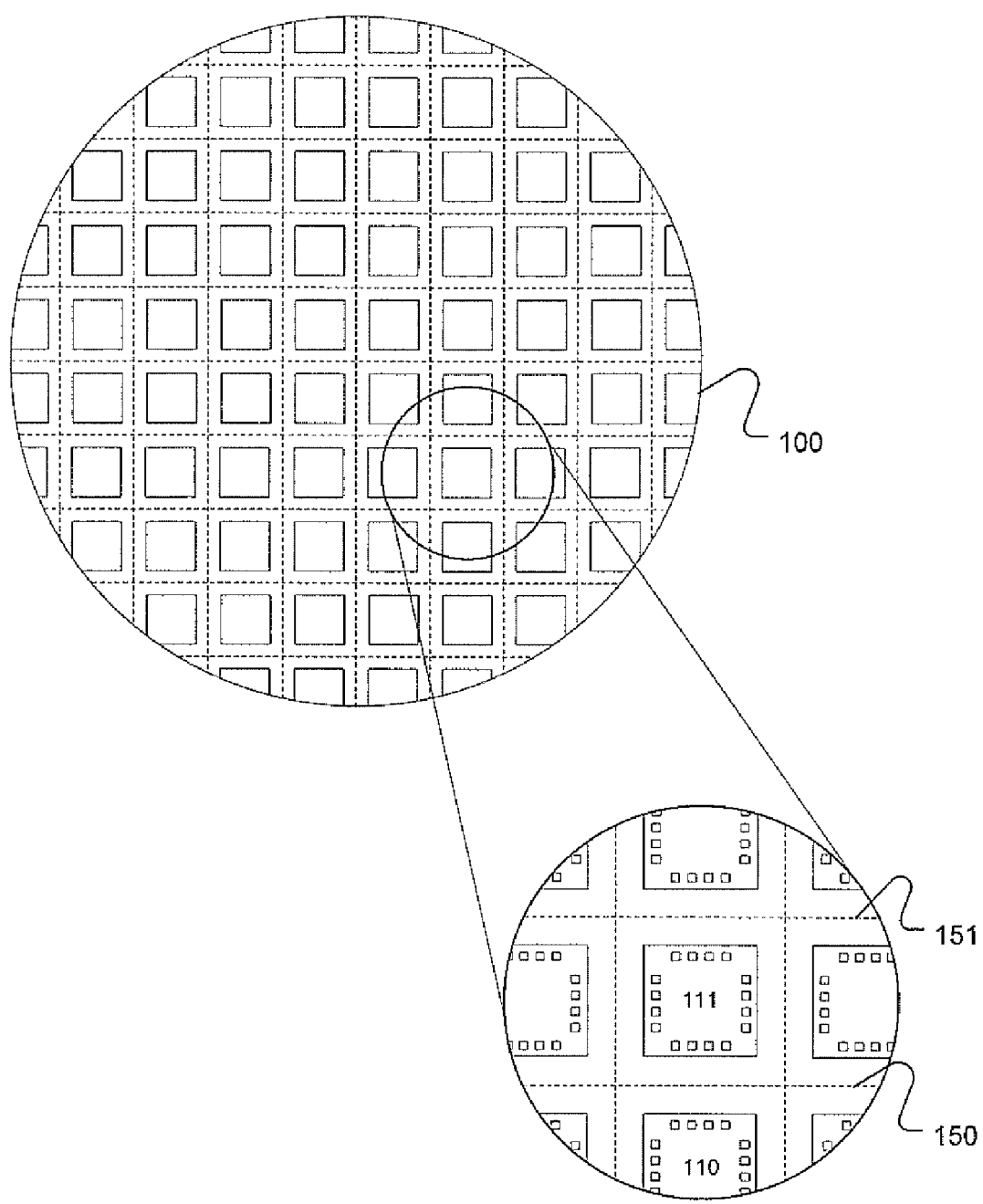
FIG. 1 is a diagram showing an enlarged top-down view of semiconductor dies on a conventional semiconductor wafer.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "connected to," "coupled with," "coupled to," and "in communication with" (which terms also refer to direct and/or indirect relationships between the connected, coupled and/or communication elements unless the context of the term's use unambiguously indicates otherwise) may be used interchangeably, but these terms are also generally given their art-recognized meanings. Unless specifically stated otherwise and/or as is apparent from the following disclosure, it is appreciated that throughout the present application, disclosure utilizing terms such as "mesh," "screen," "network," or the like, refer to an interconnected and/or overlapping arrangement of traces, wires, or other conductive material(s). Similarly, the terms "array," "grid," and "matrix" generally refer to a two dimensional arrangement of items in rows and columns.

The present invention concerns a semiconductor wafer with protective devices in the scribe lines, a semiconductor die, methods for forming such wafers and dies, and methods for protecting a semiconductor wafer. The semiconductor wafer generally comprises (a) first and second adjacent semiconductor die regions, (b) a protective device in a scribe line region between the die regions, and (c) at least one metal line on a surface of the first die region, wherein the at least one metal line is in electrical communication with the protective device. In a preferred embodiment, the at least one metal line comprises a mesh on the surface of the first die region. In another preferred embodiment, the protective device may comprise an ESD protective device.

The semiconductor die (e.g., a semiconductor die produced by dicing a wafer according to the present invention) comprises (a) an exposed terminal on a surface of the semiconductor die, wherein the exposed terminal is configured to communicate electrical signals to or from the semiconductor die, and (b) a mesh of metal lines on the surface of the semiconductor die, wherein the mesh is not in electrical communication with the exposed terminal. The semiconductor die may contain integrated circuit devices such as, for example, application specific integrated circuits [ASICs], microprocessors, system-on-chip [SOC] architectures, receivers, transmitters, controllers for data storage and/or retrieval, signal processors, etc. The semiconductor device also generally has little or no ESD protection structures or circuits therein.

The method of forming a semiconductor device (e.g., an integrated circuit device) includes the steps of (a) forming a semiconductor device in a first semiconductor die region on a semiconductor wafer, (b) forming a protective device in a scribe line region between the first semiconductor die regions and an adjacent second semiconductor die region, and (c) forming at least one metal line on a surface of the first die regions, wherein the at least one metal line is in electrical communication with the protective device.

The method of protecting a semiconductor wafer includes the steps of (a) forming an electrostatic discharge (ESD) protective device in a scribe line region of a semiconductor wafer (wherein the wafer comprises a plurality of semiconductor devices formed in a plurality of semiconductor die regions and one or more scribe line regions, each scribe line region positioned between two adjacent semiconductor die regions), (b) forming at least one metal line on a surface of at least one of the plurality of semiconductor die regions r, wherein the at least one metal line is in electrical communication with the ESD protective device, and (c) processing the wafer after forming the at least one metal line.

An Exemplary Semiconductor Wafer

In one aspect, the present invention relates to a semiconductor wafer comprising (a) a plurality of semiconductor devices in or on a plurality of semiconductor die regions, (b) at least one protective device in or on one or more scribe line regions between the die regions, and (c) at least one metal line on a surface of at least one of the semiconductor devices, in electrical communication with at least one of the protective devices. In a preferred embodiment, the metal line(s) comprise a mesh of metal lines on the surface of each semiconductor device. In another preferred embodiment, the protective device may comprise an ESD protective device. The metal line(s) or mesh of metal lines may thus serve as an antenna to attract an electrostatic discharge and shunt the discharge to ground through the ESD protective device, thus protecting the semiconductor device(s).

Thus, the present invention also relates to a semiconductor wafer comprising (a) a plurality of semiconductor devices in or on a plurality of semiconductor die regions, (b) means for dissipating electrostatic discharge, wherein the means for dissipating is formed in one or more scribe line regions between the die regions, and (c) means for transmitting the electrostatic discharge from the die regions to the means for dissipating.

In one embodiment, the ESD protective device may comprise a diode in electrical communication with a ground potential. In another embodiment, the ESD protective device may comprise a transistor in electrical communication with a ground potential. In a further embodiment, the transistor may be configured as a thin oxide capacitor, wherein the source and drain regions of the transistor are connected to a ground potential, and the gate region of the transistor is connected to the metal line(s) on the surface of the semiconductor die region. For example, the thin oxide capacitor may be configured to have a relatively low breakdown voltage.

Referring now to FIG. 1, semiconductor wafer 100 may have a plurality of semiconductor devices formed in or on a plurality of semiconductor die regions (e.g., semiconductor die region 110). Generally, the wafer 100 will have one semiconductor device per semiconductor die region 110. Wafer 100 may also have a plurality of scribe line regions (e.g., a scribe line region around scribe line 150). Those skilled in the art will recognize that the scribe line regions generally correspond to the areas of the wafer 100 between die regions 110. The process of separating the individual semiconductor die regions (and thus the semiconductor devices) is known as "dicing." The dicing process will generally cut through some wafer material on either side of the scribe line 150, and the width of this cut is generally known as the kerf width. Parts of the scribe line region with the kerf width (e.g., the width of the scribe line region) around scribe line 150 are typically destroyed when the wafer 100 is separated into individual dies (e.g., by sawing the wafer along the scribe lines). In conventional dicing processes the kerf width generally varies from 20 to 150 μm. Die regions 110 are generally arranged in an array formation, with rows and columns of die regions. Thus, the scribe line regions are generally straight lines between the rows and columns of die regions 110.

Figure 2:
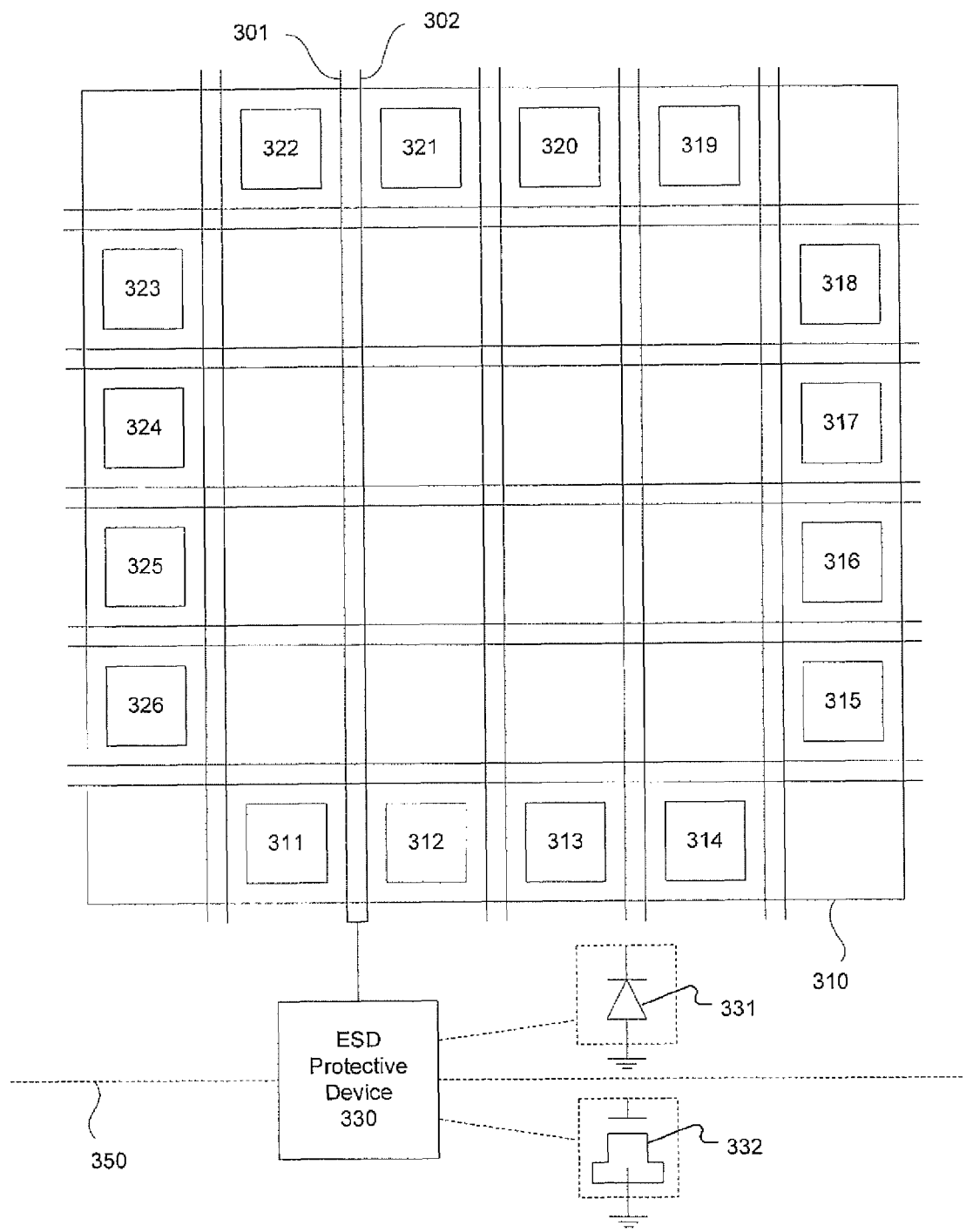
FIG. 2 is a diagram showing an embodiment of a semiconductor die according to the present invention.

FIG. 2 shows an exemplary semiconductor die region 310 and an exemplary scribe line region around scribe line 350. The semiconductor die region 310 generally corresponds to one of the semiconductor devices on a semiconductor wafer (e.g., semiconductor die region 110 on semiconductor wafer 100 of FIG. 1). Die region 310 may have exposed terminals 311-326 (e.g., bond pads or bump pads) formed on a surface of the die region 310 for input and/or output with the semiconductor device (e.g., an integrated circuit device) formed therein. Those skilled in the art will recognize that the "surface" of the wafer and/or the die regions is generally the outermost (e.g., exposed) surface of the wafer/die, or the upper surface of a particular material on the wafer/die (e.g., the uppermost metal layer, the uppermost passivation layer [e.g., an oxide, nitride, or polyimide layer], etc.). One or more metal lines 301 and 302, for example, may be formed on the same surface of the die region as exposed terminals 321 and 322, but such metal lines 301 and 302 generally are not in electrical communication with the exposed terminals 321 and 322. The metal lines may form a mesh, and may be in electrical communication with ESD protective device 330.

ESD protective device 330 is formed in the scribe line region around scribe line 350. The ESD protective device 330 may be large relative to components of the semiconductor device in die region 310, particularly if the semiconductor device has a minimum design rule of 0.13 μm or less. However, the scribe line region is generally destroyed during the die separation process in any case, so the ESD protective device 330 can provide protection during the wafer manufacturing and handling process, without consuming valuable wafer area (e.g., because the scribe line region is generally destroyed and therefore has no value after the die separation process).

ESD protective device 330 may comprise, for example, a diode 331 in electrical communication with a ground potential, or a transistor 332 configured as a thin oxide capacitor (e.g., a thin oxide capacitor with a relatively low breakdown voltage), wherein the source and drain regions of the transistor 332 are connected to a ground potential, and the gate region of the transistor 332 is connected to the metal line(s) (e.g., metal lines 301 and 302) on the surface of the semiconductor die region 310.

Figure 3:
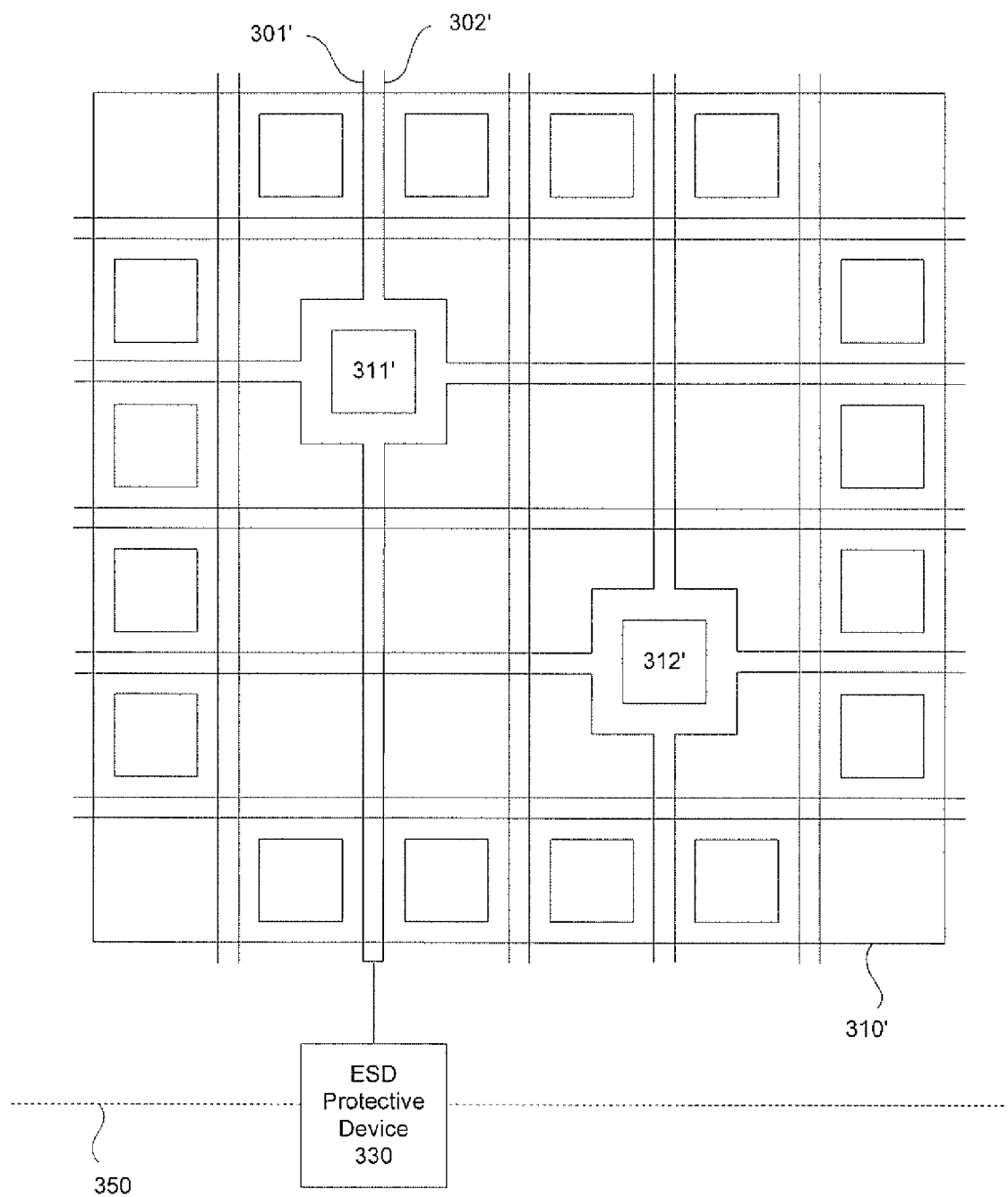
FIG. 3 is a diagram showing an alternate embodiment of a semiconductor die according to the present invention.

The exposed terminals may be placed regularly around the edge of the die region 310, as exemplified by exposed terminals 311-326 of FIG. 2, or they may be placed in the interior of the die region or in an irregular fashion, as exemplified by exposed terminals 311' and 312' of FIG. 3. The exposed terminals are generally arranged in a grid, such that the terminals are lined up in rows and columns on the surface of each semiconductor die region. In a preferred embodiment, the terminals may be arranged in a regular pattern on the grid. For example, the terminals may be arranged in an x-by-y array on each semiconductor die region, where x and y are independent of each other and are integers of at least 4, 6, 8 10, or 12, etc. The array of terminals on each die region may have one or more gaps or open spaces in the middle of the array (e.g., a region within the array without any corresponding terminals). The gap may have a regular shape, such as a rectangle corresponding to an x'-by-y' array, where x' and y' may be independent of each other and are integers of at least 2, 4, 6, or more, such that differences (x-x') and (y-y') are each an integer of 2, 4, 6, or more. Thus, the terminals may form a perimeter around the inner edges of the die region that is 1, 2, 3, or more terminals deep from the edges of the die region.

The metal lines may be arranged in a regular order (e.g., the mesh of metal lines including lines 301 and 302 in FIG. 2), or they may be arranged to route around irregularly placed exposed terminals (e.g., metal lines 301' and 302' of FIG. 3). For example, when the exposed terminals are arranged in an array of ordered rows and columns, the lines may run between the rows and columns to form a grid of metal lines across the surface of the die region. One, two, or more lines may run between two adjacent rows and/or columns in the array of exposed terminals. The metal lines generally are not in electrical communication with the exposed terminals.

Figure 4A:
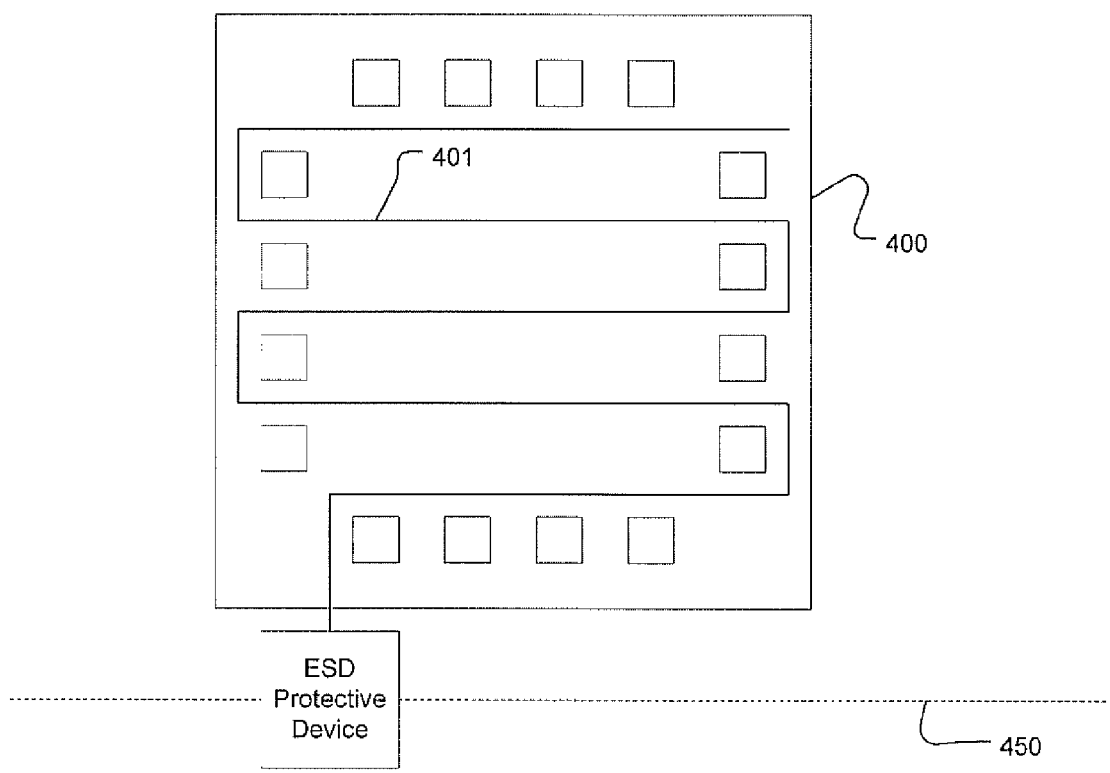
FIGS. 4A-C are diagrams showing additional alternate embodiments of a semiconductor die according to the present invention.

Furthermore, the metal line(s) may have an antenna-like shape to attract electrostatic discharges toward the ESD protective device and away from the exposed terminals of the semiconductor device. For example, FIG. 4A shows metal line 401 on semiconductor die 400, where metal line 401 has a serpentine shape having a plurality of horizontal sections and a plurality of vertical sections. The resulting "serpentine" metal line may wrap around the exposed terminals, or may occupy a gap area on the die 400 where there are no exposed terminals.

Figure 4B:
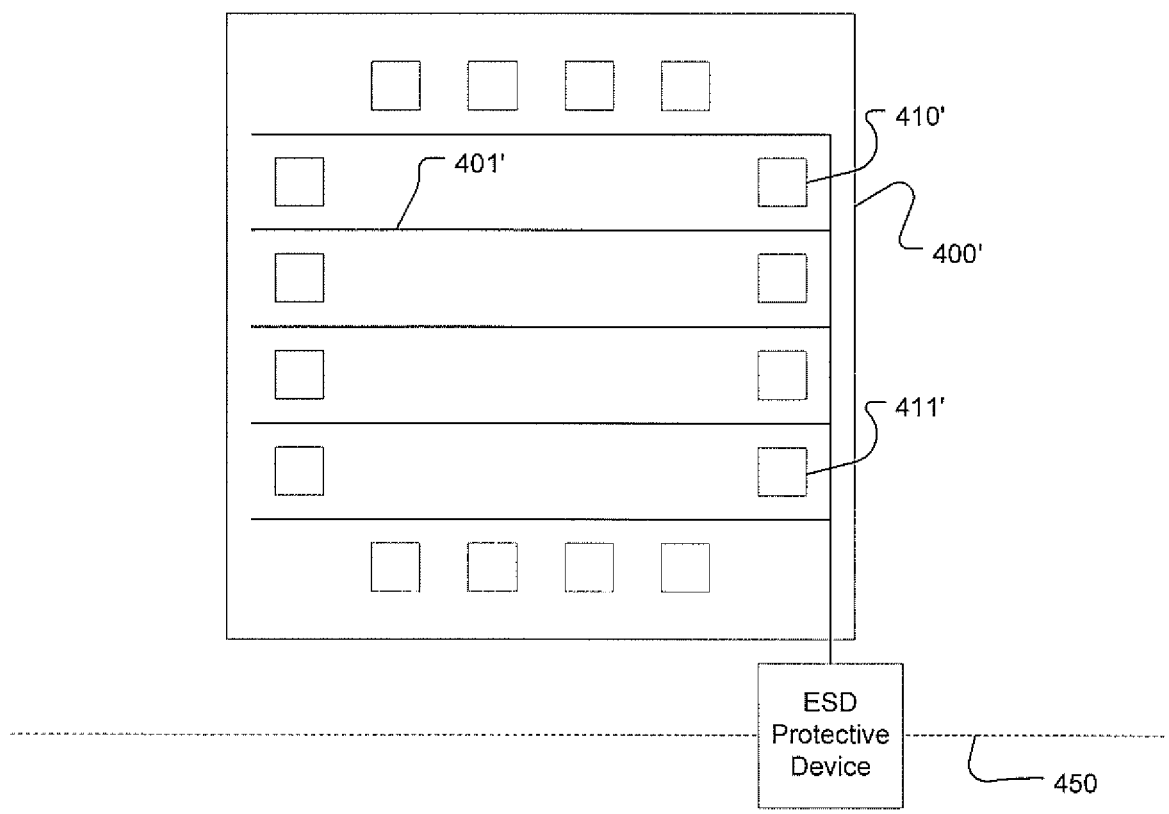

FIG. 4B shows metal line 401' on semiconductor die 400', where metal line 401' has a "comb" or "finger" shape comprising a first section along one dimension of the die 400' (e.g., along a substantial length of that dimension) and a plurality of sections perpendicular to the first section. The first section may run along an edge of the die 400' outside of terminals 410' and 411', or it may run inside the terminals, to reduce the likelihood of stresses in the die corners and/or to reduce the propagation time of an overvoltage along the section coupled the ESD protective device. For example, the metal line may be formed in a "T" shape, comprising a first section along one dimension of the die (e.g., along a substantial length of that dimension) and one or more additional sections perpendicular to the first section (e.g., intersecting the first line section at a midpoint of the additional section or sections). In any event, the metal line is in electrical communication with an ESD protective device (e.g., a protective device in a scribe line region) in order to provide ESD protection to the wafer. Based on the disclosure provided herein, those skilled in the art should be capable to design a variety of metal line patterns to route around exposed terminals of the semiconductor device, and to most effectively draw electrostatic discharges to the protective device(s) and away from the exposed terminals.

It should be understood that one ESD protective device may be shared by multiple semiconductor die regions. For example, the metal lines on or over multiple die regions may be in electrical communication with a single ESD protective device, by extending one or more metal lines on or over each of the die regions into the scribe line region(s) to form an electrical connection to the ESD protective device. These metal lines may be connected to, e.g., a metal plug in a contact hole in electrical communication with an ESD protective device formed in lower layers of the semiconductor wafer substrate. Alternatively, the metal lines on a semiconductor die region may be in electrical communication with multiple ESD protective devices. Consequently, the metal lines on multiple die regions may be in electrical communication with independent, overlapping, or identical sets of ESD protective devices.

Figure 4C:
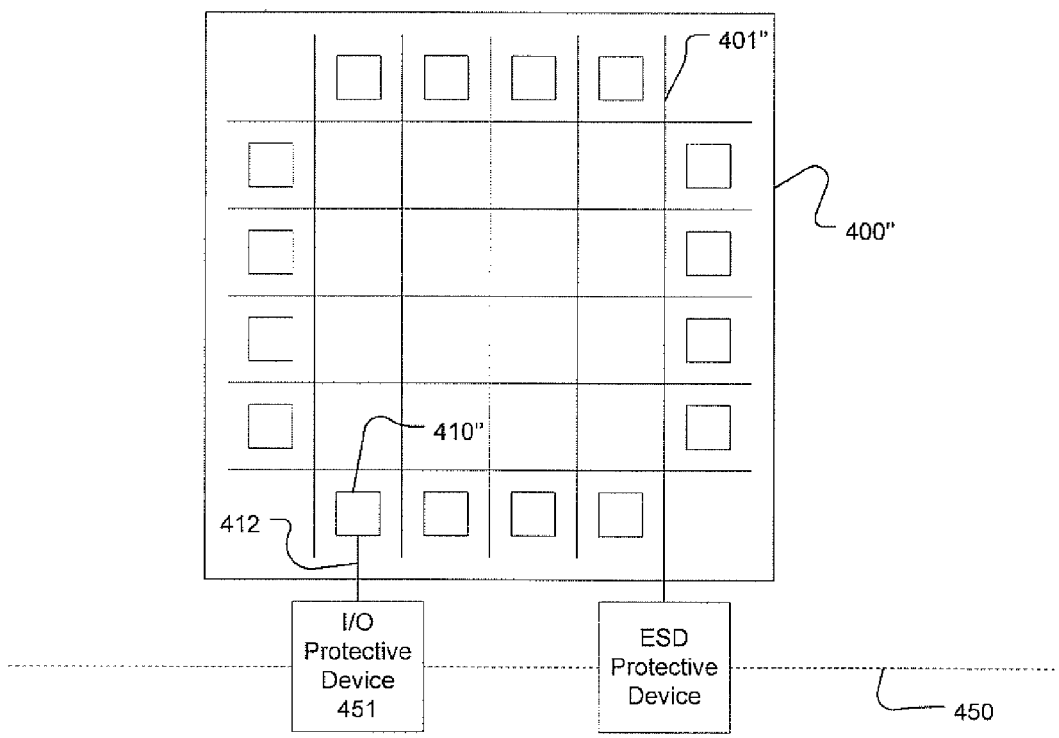

Referring now to FIG. 4C, the scribe line region around scribe line 450 may also contain input and/or output (I/O) protective device 451. Those skilled in the art will recognize that, as with ESD structures, the size of many semiconductor structures may be independent or less dependent on process size. Thus, the scribe line regions may also include voltage regulators, I/O driver circuits, capacitors, and/or inductors, etc. Exposed terminal 410" may be in electrical communication (e.g., through a metal line 412) to I/O protective device 451. Thus, protective device 451 may provide overvoltage or other I/O protection for exposed terminal 410" (and thereby provide protection for the semiconductor device(s) in the semiconductor die regions which are coupled to exposed terminal 410") during the wafer manufacturing process.

An important part of the wafer manufacturing process is the testing step known as "wafer sort." The wafers are generally tested to determine which of their die(s) are functional and/or non-defective. In this test, an intact wafer may be mounted on a vacuum chuck. The wafer may then be aligned so the electrical probes of a tester can contact each of the exposed terminals of one of the die regions. The test process is generally controlled by a computerized test system which can apply electrical signals to the exposed terminals to test the semiconductor device(s) in a die region for desired functionality. The test system generally tests the die regions one at a time, and marks defective and/or functional dies with ink and/or stores a list of defective and/or functional dies in a database, so that defective dies can be discarded after the dicing process.

During the test process overvoltages (e.g., electrostatic discharges) may be inadvertently applied to the exposed terminals. Even with a metal mesh to direct electrostatic discharge to ESD protective devices in the scribe line, the semiconductor devices in the die region may be damaged if the test probe applies an overvoltage directly to an exposed terminal. For example, the test probe may pass transient or sustained voltages significantly above nominal to the exposed terminals of the dies. Therefore, protective device 451 in the scribe line region around scribe line 450 can provide overvoltage or other protection against electrical signals that may be applied directly to exposed terminal 410. As with other devices formed in the scribe line region, protective device 451 may generally be formed using the same materials and in the same manufacturing steps as the integrated circuit devices in the semiconductor die region. Also as with other devices formed in the scribe line region, protective device 451 is generally destroyed during the wafer dicing process, and therefore does not consume valuable semiconductor die area.

In a further embodiment, the semiconductor devices in the die regions may have little or no ESD protection structures therein capable of protecting the devices from electrostatic discharges. Thus, as shown above, valuable die area is not consumed by ESD and/or other protection structures. Therefore, it may be desirable to attach the resulting semiconductor dies to another die or substrate that has ESD and/or other protection structures (see, e.g., U.S. patent application Ser. No. 11/505,782, filed Aug. 16, 2006, pending, and U.S. Provisional Application No. 60/765,968, filed Feb. 7, 2006, the relevant portions of which are hereby incorporated by reference).

In another embodiment, the semiconductor devices generally each have at least one exposed (e.g., exposed terminals 311-326 in FIG. 3) that is not in electrical communication with the metal line(s) or mesh. The number of exposed terminals may be small, but generally, each semiconductor device will have a relatively large number of exposed terminals for input and/or output (e.g., from 32 to 1,000 or more of exposed terminals). The exposed terminals generally comprise bump pads or bond pads. For example, the bump pads may be used to attach the semiconductor device to a substrate or to another die via a subsequent flip-chip bonding process (e.g., a controlled collapse chip connect (C4) bonding process). Alternatively, the bond pads may be used for subsequent wire bonding. In a preferred embodiment, the metal line(s) and/or mesh is not in electrical communication with the semiconductor device at all. Thus, any ESD discharge may be diverted away from the exposed terminals and the underlying semiconductor device, and may be shunted to ground through the ESD protective device.

In a preferred embodiment, the semiconductor devices (either individually or collectively on a wafer) may have a minimum design rule of 0.13 µm or less. As the minimum design rule size decreases, the sizes of ESD protective structures generally do not decrease as much as the sizes of most components in a semiconductor device. Thus, as the size of other components decrease, the relative sizes of ESD protective structures increase. The cost of a component in a semiconductor device generally correlates to the amount of space on a semiconductor die that the component consumes. Therefore, as ESD protective devices become larger relative to other semiconductor device components, the ESD protective devices also become more expensive relative to those other components. Therefore the present invention is particularly advantageous for more advanced semiconductor design rules (e.g., 0.13 µm, 90 nm, 65 nm, or smaller minimum design rules). Thus, wafers and semiconductor dies according to the present invention can take advantage of modern design rules and/or manufacturing technology for those components that can most advantageously benefit from such design rules and/or manufacturing technologies, while some components that generally do not benefit as much from such advanced technology can be moved "off chip" (e.g., moved out of the semiconductor die regions of a semiconductor wafer).

Exemplary Methods of Forming Semiconductor Devices

The present invention also relates to a method of forming a semiconductor device (e.g., an integrated circuit device). The method includes the steps of (a) forming the semiconductor device a semiconductor die region on a semiconductor wafer, (b) forming a protective device in a scribe line region between the first die region and an adjacent second die region, and (c) forming at least one metal line on a surface of the first die region, wherein the at least one metal line is in electrical communication with the protective device. In a preferred embodiment, the step of forming at least one metal line may include forming a mesh on the surface of one of the semiconductor devices. In another preferred embodiment, the step of forming the protective device may include forming an electrostatic discharge (ESD) protective device.

It will be recognized that semiconductor wafers are generally manufactured with a relatively large number of substantially identical semiconductor die regions, each one containing substantially identical semiconductor devices. Thus, a method of forming a semiconductor device according to the present invention may include forming a plurality of substantially identical semiconductor devices in a respective plurality of semiconductor die regions. Referring again to FIG. 1, semiconductor devices may be formed in each of the semiconductor die regions (e.g., die regions 110 and 111). ESD protection devices may be formed in scribe line regions of the wafer (e.g., around scribe lines 150 and 151). At least one metal line (e.g., a mesh comprising a plurality of substantially horizontal lines and a plurality of substantially vertical lines) may then be formed on a surface of each die region (e.g., die regions 110 and 111), and in electrical communication with the ESD protection devices in scribe line regions of the wafer (e.g., in the regions around scribe lines 150 and 151).

In a further embodiment, the step of forming an ESD protective device may include forming a diode in electrical communication with a ground potential. In another embodiment, the step of forming an ESD protective device may include forming a transistor in electrical communication with a ground potential. The transistor may be configured as a low-capacitance capacitor, so that the step of forming the transistor may include connecting source and drain regions to a ground potential, and connecting a gate region of the transistor to the at least one metal line on the surface. Material layers (e.g., metal layers, insulator layers, contact layers, etc.) in the ESD protective devices can be made using common layers used in/on the semiconductor devices formed in the semiconductor die regions. Thus, no additional manufacturing steps may be required to form the ESD protective devices in the scribe line regions.

In one exemplary embodiment, each of the semiconductor devices may have little or no ESD protection structures therein capable of protecting the device from electrostatic discharges. Thus, as shown above, valuable die area is not consumed by relatively bulky ESD protection structures. Therefore, it may be desirable to attach the resulting semiconductor dies to another die or substrate that has ESD protection structures (see, e.g., U.S. patent application Ser. No. 11/505,782, filed Aug. 16, 2006, pending, and U.S. Provisional Application No. 60/765,968, filed Feb. 7, 2006, the relevant portions of which are hereby incorporated by reference).

Accordingly, the step(s) of forming a plurality of semiconductor devices are performed according to a process having minimum design rules of 0.13 μm or smaller (e.g., the semiconductor devices may have a minimum design rule of 0.13 μm or less). As disclosed herein, at such design rule dimensions, the size of the ESD protective structure generally does not decrease as much as the size of most components in the semiconductor device. Thus, the ESD protective device becomes relatively larger, and relatively more expensive, compared to other components. Therefore the present invention is particularly advantageous for more advanced semiconductor design rules (e.g., 0.13 μm, 90 nm, 65 nm, 45 nm, or smaller minimum design rules).

In another embodiment, the step of forming a plurality of semiconductor devices may include forming at least one exposed terminal on the surface of one of the semiconductor devices, wherein the exposed terminal is not in electrical communication with the metal line(s) or metal mesh. The number of exposed terminals may be small, but generally, the method will include forming a relatively large number of exposed terminals for input and/or output (e.g., from 32 to 1,000 or more of exposed terminals). The step of forming exposed terminals may include forming bump pads (e.g., for attachment to substrate or to another die via a subsequent flip-chip bonding process) or may include forming bond pads (e.g., for subsequent wire bonding).

In a preferred embodiment, the step of forming a plurality of bond pads or bump pads and the step of forming at least one metal line may occur simultaneously. For example, the process may include the steps of depositing a substantially uniform metal film on the surface of the wafer, and then performing a photolithographic process to form the ball or bump pads and the metal line(s).

In another embodiment, the method may include a step of dicing the wafer to separate the plurality of semiconductor devices. The dicing step may comprise sawing through the wafer. The line along which the wafer is cut is generally known as the scribe line (e.g., scribe line region 150 or 151 of FIG. 1). Those skilled in the art will recognize that the sawing process will cut through some wafer material on either side of the scribe line, and the width of this cut is generally known as the kerf width. Typical kerf widths in conventional semiconductor wafer dicing processes range from about 20 μm to about 150 μm, and are more typically between 40 and 70 μm (although as technologies advance the minimum and typical kerf widths may be expected to decline). Thus, in another embodiment the dicing step may include sawing through the one or more scribe line regions. The width of the scribe line regions may generally correspond to the kerf width of the sawing process employed.

Exemplary Methods of Protecting a Semiconductor Wafer

The invention further relates to a method of protecting a semiconductor wafer from electrostatic discharge. As disclosed herein, the wafer generally comprises a plurality of semiconductor devices formed in or on a plurality of semiconductor die regions and one or more scribe line regions between the die regions. The method of protecting a semiconductor wafer includes the steps of (a) forming at least one electrostatic discharge (ESD) protective device in the scribe line region(s) of a semiconductor wafer, (b) forming at least one metal line on a surface of at least one semiconductor die region on the semiconductor wafer, and in electrical communication with at least one protective device, and (c) processing the wafer after forming the at least one metal line.

In further embodiments, the method may include coupling the ESD protective device to ground, and/or forming an input/output (I/O) device or circuit in the scribe line region(s), wherein the I/O device or circuit is in electrical communication with a terminal in a semiconductor die region. In the latter embodiment, the semiconductor die region may be the same as the semiconductor die region having the at least one metal line thereon. In a preferred embodiment, the metal line(s) may comprise a mesh on the surface of each of the semiconductor die regions. Alternatively, the metal line may comprise a serpentine metal line or a comb- or finger-shaped metal line (see, e.g., FIGS. 4B-4C). The metal line(s) or mesh of metal lines may thus serve as an antenna to attract an electrostatic discharge and shunt the discharge to ground through the ESD protective device, thus protecting the semiconductor device(s). Thus, in another embodiment the method of protecting may further comprise shunting the ESD away from the exposed terminal and to the ESD protective device.

In another embodiment, the ESD protective device may comprise a diode in electrical communication with a ground potential. In another embodiment, the ESD protective device may comprise a transistor in electrical communication with a ground potential. In a further embodiment, the transistor may be configured as a thin oxide capacitor (e.g., a thin oxide capacitor with a relatively low breakdown voltage), wherein the source and drain regions of the transistor are connected to a ground potential, and the gate region of the transistor is connected to the metal line(s) on the surface of the semiconductor die region. Alternatively, the ESD protective device may comprise a conventional capacitor formed using conventional MOS manufacturing techniques. Such a capacitor can be quite large, relative to capacitors that are formed in the die region, because of their placement in the scribe line of the wafer.

In one exemplary embodiment, each of the semiconductor devices may have little or no ESD protection structures therein capable of effectively protecting the device from electrostatic discharges. In another embodiment, the surface of one of the semiconductor devices may comprise at least one exposed terminal, wherein the exposed terminal is not in electrical communication with the at least one metal line. Accordingly, in a further embodiment, the semiconductor devices may have no input or output protective devices (e.g., large input buffers and/or output drivers, relative to the minimum design rules of the manufacturing process used to make the semiconductor devices and/or the wafer) in electrical communication with the exposed terminal(s).

CONCLUSION/SUMMARY

Thus, the present invention provides a semiconductor wafer with an ESD protective device. The present invention advantageously provides protective devices (e.g., ESD protective devices) during the wafer manufacturing process for semiconductor devices that may otherwise lack significant protective devices. The protective devices are located in scribe line regions which are destroyed when the wafer is sawed or otherwise separated into individual semiconductor die, so that valuable space on the finished semiconductor device is not consumed by structures which do not benefit as much from smaller (and/or more expensive) process technology.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming a semiconductor wafer, the method comprising:
    forming a first semiconductor device in a first semiconductor die region on the semiconductor wafer;
    forming a second semiconductor device in a second semiconductor die region on the semiconductor wafer;
    forming a protective device in a scribe line region between (i) the first semiconductor die region and (ii) the second semiconductor die region;
    forming a first mesh of metal lines on a surface of the first semiconductor die region, wherein the first mesh of metal lines is in electrical communication with the protective device;
    forming a second mesh of metal lines on a surface of the second semiconductor die region, wherein the second mesh of metal lines is in electrical communication with the protective device;
    forming a first plurality of exposed terminals on the surface of the first semiconductor device, wherein the first plurality of exposed terminals is not in electrical communication with the first mesh of metal lines; and
    forming a second plurality of exposed terminals on the surface of the second semiconductor device, wherein the second plurality of exposed terminals is not in electrical communication with the second mesh of metal lines.

2. The method of claim 1, wherein forming the protective device comprises forming an electrostatic discharge (ESD) protective device.

3. The method of claim 2, wherein forming an ESD protective device comprises forming one of (i) a diode, (ii) a transistor or a (iii) a capacitor.

4. The method of claim 3, wherein forming an ESD protective device comprises forming the ESD protective device such that the ESD protective device is in electrical communication with a ground potential.

5. The method of claim 1, wherein forming the first semiconductor device is performed according to a process having a minimum design rule of 0.13 μm or smaller.

6. The method of claim 1, wherein forming the second semiconductor device is performed according to a process having a minimum design rule of 0.13 μm or smaller.

7. The method of claim 1, wherein forming the first plurality of exposed terminals comprises forming a first plurality of one of (i) bond pads or (ii) bump pads.

8. The method of claim 1, wherein forming the second plurality of exposed terminals comprises forming a second plurality of one of (i) bond pads or (ii) bump pads.

9. The method of claim 1, further comprising sawing the semiconductor wafer through the scribe line region.

10. A method of protecting a semiconductor wafer from electrostatic discharge, wherein the wafer comprises (i) one or more scribe line regions and (ii) a plurality of semiconductor devices formed in a plurality of semiconductor die regions, each scribe line region positioned between two adjacent semiconductor die regions, the method comprising:
    forming an electrostatic discharge (ESD) protective device in one of the scribe line regions;
    forming a first mesh of metal lines on a surface of a first semiconductor die region, wherein the first mesh of metal lines is in electrical communication with the ESD protective device;
    forming a second mesh of metal lines on a surface of a second semiconductor die region, wherein the second mesh of metal lines is in electrical communication with the ESD protective device;
    forming a first plurality of exposed terminals on the surface of a first semiconductor device within the first die semiconductor region, wherein the first plurality of exposed terminals is not in electrical communication with the first mesh of metal lines; and
    forming a second plurality of exposed terminals on the surface of a second semiconductor device within the second semiconductor die region, wherein the second plurality of exposed terminals is not in electrical communication with the second mesh of metal lines; and
    processing the semiconductor wafer.

11. The method of claim 10, further comprising coupling the ESD protective device to a ground potential.

12. The method of claim 10, further comprising shunting an electrostatic discharge to the ESD protective device when at least one of the plurality of semiconductor die regions is exposed to the discharge.

13. The method of claim 10, wherein forming an ESD protective device comprises forming one of (i) a diode, (ii) a transistor or a (iii) a capacitor.

14. The method of claim 10, wherein forming an ESD protective device comprises forming the ESD protective device such that the ESD protective device is in electrical communication with a ground potential.

15. The method of claim 10, wherein forming the first semiconductor device is performed according to a process having a minimum design rule of 0.13 μm or smaller.

16. The method of claim 10, wherein forming the second semiconductor device is performed according to a process having a minimum design rule of 0.13 μm or smaller.

17. The method of claim 10, wherein forming the first plurality of exposed terminals comprises forming a first plurality of one of (i) bond pads or (ii) bump pads.

18. The method of claim 10, wherein forming the second plurality of exposed terminals comprises forming a second plurality of one of (i) bond pads or (ii) bump pads.

19. The method of claim 10, wherein processing the semiconductor wafer comprises sawing the semiconductor wafer through the scribe line region.

\* \* \* \* \*